United States Patent
Zhang et al.

(10) Patent No.: US 7,440,738 B2
(45) Date of Patent: Oct. 21, 2008

(54) AUTOMATIC GAIN CONTROL WITH TWO POWER DETECTORS

(75) Inventors: Yifeng Zhang, San Jose, CA (US); Henk Visser, Wijchen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/548,419

(22) PCT Filed: Mar. 10, 2004

(86) PCT No.: PCT/IB2004/000665

§ 371 (c)(1), (2), (4) Date: Nov. 15, 2006

(87) PCT Pub. No.: WO2004/082134

PCT Pub. Date: Sep. 23, 2004

(65) Prior Publication Data

US 2007/0077894 A1 Apr. 5, 2007

Related U.S. Application Data

(60) Provisional application No. 60/454,397, filed on Mar. 12, 2003.

(51) Int. Cl.
  *H04B 1/06* (2006.01)
  *H04B 7/00* (2006.01)

(52) U.S. Cl. .............. 455/234.1; 455/254; 455/241.1; 455/253.2; 455/250.1; 455/240.1

(58) Field of Classification Search ............. 455/127.3, 455/232.1–254

See application file for complete search history.

(56) References Cited

U.S. PATENT DOCUMENTS

| | | | | |
|---|---|---|---|---|
| 5,513,387 A * | 4/1996 | Saito et al. ............... | 455/243.1 |
| 6,134,430 A * | 10/2000 | Younis et al. ............. | 455/340 |
| 6,373,907 B1 * | 4/2002 | Katsura et al. ............ | 375/345 |
| 6,498,927 B2 * | 12/2002 | Kang et al. ............... | 455/245.2 |
| 6,625,433 B1 * | 9/2003 | Poirier et al. ............ | 455/232.1 |
| 6,678,506 B1 * | 1/2004 | Dolman et al. ........... | 455/127.3 |
| 6,728,524 B2 * | 4/2004 | Yamanaka et al. ....... | 455/232.1 |
| 6,748,200 B1 * | 6/2004 | Webster et al. .......... | 455/234.1 |
| 6,885,851 B1 * | 4/2005 | Miura ...................... | 455/234.1 |
| 6,993,291 B2 * | 1/2006 | Parssinen et al. ......... | 455/67.11 |
| 7,005,922 B2 * | 2/2006 | Oshima et al. ............ | 330/278 |
| 7,113,758 B2 * | 9/2006 | Kishi ....................... | 455/234.1 |
| 7,212,798 B1 * | 5/2007 | Adams et al. ............. | 455/251.1 |
| 7,257,383 B2 * | 8/2007 | Young et al. .............. | 455/138 |
| 7,353,010 B1 * | 4/2008 | Zhang et al. .............. | 455/234.1 |
| 2003/0027538 A1 * | 2/2003 | Masumoto et al. ....... | 455/234.1 |
| 2003/0162518 A1 * | 8/2003 | Baldwin et al. ........... | 455/253.2 |
| 2004/0063413 A1 * | 4/2004 | Schaffer et al. ........... | 455/234.1 |

* cited by examiner

*Primary Examiner*—Edward Urban
*Assistant Examiner*—RuiMeng Hu

(57) ABSTRACT

A receiver (100) adjusts its overall gain based on the detected power level of an incoming signal. The receiver is built with two detectors (D1, D2) which operate with different detecting ranges within the dynamic range of the incoming signal. If the actual power level of the incoming signal falls within one of the resolving ranges, an automatic gain control adjusts the gain of the receiver to a corresponding gain value. If not, the resolving range of one of the two detectors is shifted and eventually reduced to cover the portion of the dynamic range in which the power level is comprised. The gain of the receiver is then temporarily adjusted and a new measurement is carried out by the detector using the new resolving range. The AGC then re-adjusts the gain of the receiver based on the measurement given by the modified detector.

13 Claims, 3 Drawing Sheets

AUTOMATIC GAIN CONTROL WITH TWO POWER DETECTORS

CROSS REFERENCE TO RELATED APPLICATION

This application claims the benefit of U.S. provisional application Ser. No. 60/454,397 filed 12 Mar. 2003, which is incorporated herein by reference.

The invention generally relates to the field of wireless communication systems and automatic gain control in WLAN transceivers and receivers. The invention more specifically pertains to a new scheme for an automatic gain control using two parallel power level detectors.

Communication devices must regulate the power at which they transmit signals over the wireless medium, and because the transmission over a wireless medium can be inconsistent and unpredictable, communication devices must also determine the power level of incoming signals in order to adapt the internal circuitry to the characteristics of these incoming signals. Determining the power level will permit the device to control and adjust the overall gain of the receiving system to ensure efficient later detection and processing of the data comprised in the incoming signal. To this end, numerous solutions have been contemplated to adjust the gain of the RF portion of the receiver so that the incoming signal is attenuated or amplified before conversion to the digital domain and further transmission to the base-band portion of the receiver. Conventional analog to digital converters (ADC) have limited operating ranges and may introduce digitization errors outside these ranges. For example, if a received signal is too weak, the quantization levels used in a ADC may be too high to accurately represent the analog signal values. In a similar manner, if the incoming signal is too strong, the quantization steps of the ADC may lead to a truncation of the upper portion of the incoming signal. Thus, automatic gain control permits to adjust the strength of incoming signal when it reaches the ADC so that the adjusted signal better fits the quantization window of the ADC while optimizing the signal-to-noise ratio of the system.

Therefore in view of the foregoing problems, there is a need for systems and methods that adjust, in a timely manner, the gain of an overall communication system upon reception of a signal based on its power level.

The inventor has realized that a detection scheme could be designed with two power level detectors, whose resolving ranges and locations in the receiver circuit permit reliable and fast detection of the power level of the incoming signal. The inventor has therefore proposed a device comprising an input for receiving an incoming signal. The incoming signal is passed through first and second amplification stages placed in series. A first detector is connected at the output of the first amplification stage and is configured to provide a measurement of the power level of the incoming signal if the power level is within a first resolving range of the first detector. Similarly, a second power detector is placed at the output of the second amplification stage and is capable of measuring the power level of the incoming signal only if within a second resolving range of the second detector. If the power level lies outside both resolving ranges of the first and second detectors, a control unit modifies the resolving range of one of the two detectors to a new resolving range and the gain of the overall system, i.e. respective gains of the first amplification stage and second amplification stage, is adjusted to a known gain value associated with a power value comprised in the new resolving range. Once the gain of the system is set to the known value, the detector with the modified resolving range provides an approximate measure of the power level of the incoming signal and the gains of the first and second amplification stages are further adapted to respective second gain values associated with the approximate measured power level.

A power detector of the invention may detect and provide a measurement of the power value of the incoming signal if the power level falls within a predefined resolving range. If the power level is actually above the resolving range, the detector saturates and no power measurement can be done although the detector detects the signal. If the incoming signal is too weak in the sense that its power level is lower than the lower limit of the resolving range, the detector will not be capable of measuring the power level and even of detecting the signal. Thus, the resolving ranges may be chosen so that they cover portions of the dynamic range of the incoming signal and reading of the respective outputs of the detectors will indicate where in the dynamic range the signal is. In an embodiment of the invention, the first and the second resolving ranges do not overlap and the first resolving range is greater than the second resolving range, i.e. the first detector detects signals of greater power level than the second detector. If the incoming signal is determined to be located in one of the two resolving ranges, the corresponding detector provides the power level and the gains of the first and second amplification stages of the system are adjusted accordingly to respective known gain values associated with the measured power level.

If none of the two detectors provides a measurement of the power level, a controller can still further narrow down its measurements of the power of the incoming signal to a limited portion of the dynamic range. Indeed by reading the respective outputs of the first and second detectors, a controller can further deduce where the power value lies with respect to the resolving ranges: greater than the upper value of the first resolving range, between the two resolving range or lower than the lower value of the second resolving range. Then in a further step of the invention the controller temporarily adjusts the gain of the first and second amplification stages to known values associated with a power level situated in the segment to which the measurement was narrowed down. The controller also modifies the setup of one of the two detectors, preferably the second detector, which operates with a new resolving range that can overlap with the portion of the dynamic range where the power level of the signal is. This new resolving range may then permit the second detector to provide a measurement of the power level. Respective gains of first and second amplification stages are then adjusted to gain values associated with the measured power level. If the second detector is still not capable to provide a measurement of the power level, its resolving range may be further adapted and new measurements are performed. Alternately, the first and the second amplification stages are set to gain values associated with approximate values of the power level of the incoming signal.

In an embodiment of the invention, if the power level of the incoming signal is detected to be lower than a given threshold value, antenna diversity may be used and the antenna providing the stronger power value will be used for reception of the incoming signal.

The invention is explained in further detail, and by way of example, with reference to the accompanying drawings with regards exemplary embodiments of the invention and wherein.

Throughout the drawings, the same reference numerals indicate similar or corresponding features or functions.

Figure 1:
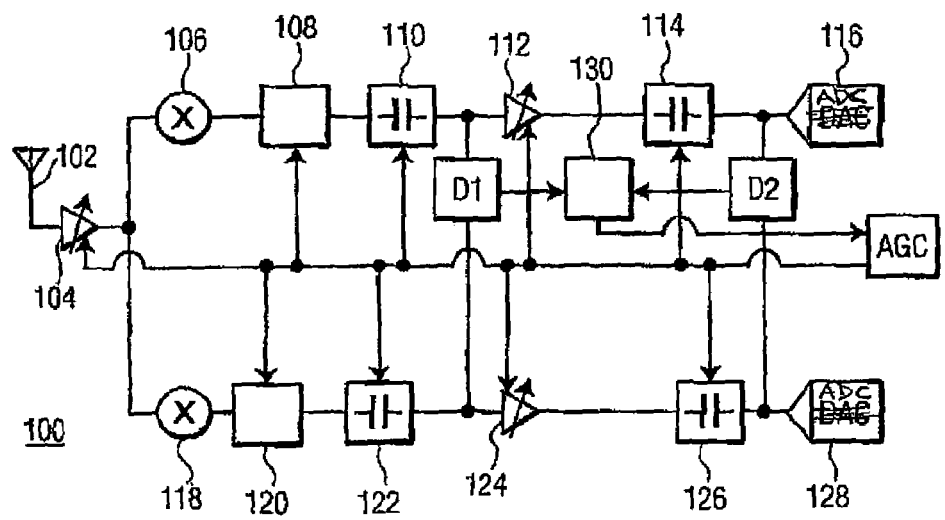
FIG. 1 illustrates a block diagram of a system of the invention.

FIG. 1 illustrates a block diagram of a receiver 100 of a transceiver system of the invention of which only the receive path is shown. Receiver 100 comprises a RF portion, digital to analog converters 116 and 128 followed by a base-band portion, not shown here. The hardware design and software implementation of the base-band portion are well known to one skilled in the art. It must also be noted that the design of receiver 100 is also not limited to the design presented here and embodiments with alternative structural elements other than those used here are also within the scope of the invention.

An incoming radio frequency signal Sin is initially received at the head-end of receiver 100 including antenna 102 and low noise radio frequency amplifier (LNA) 104. LNA 104 amplifies incoming signal Sin and the resulting amplified incoming signal is then split into an in-phase and quadrature components by mixing with a local oscillator signal in mixer 106 to produce the in-phase signal and by mixing in mixer 118 with the same oscillator signal shifted by ninety degrees to produce the quadrature component. The quadrature component is ninety degrees out-of-phase relative to the in-phase signal. Both in-phase and quadrature components are passed through a pair of filters 108 and 120, a first pair of AC-coupling 110, 122, a pair of Variable Gain Amplifier (VGA) 112, 124 and a second pair of AC-coupling 114, 126 before conversion into the digital domain by ADC 116 and 128

In an exemplary embodiment of the invention, the incoming RF signal Sin is in the 2.4 GH or 5 GHz frequency bands as defined in the IEEE 802.11a and b physical layer specifications. The invention is based on the premises that the incoming RF signal Sin exhibits a high dynamic range, e.g. 100 dBm, from −90 dBm to 5 dBm, which affects how the signal Sin will be subsequently processed. Indeed, ADC 116 and 128 only have a limited dynamic range and cannot accurately process input signals outside their respective power detecting ranges. Thus, if the signal provided to ADC 116 or 128 is too weak or too strong, the quantization steps of ADC 116 and 128 may not permit accurate representation of it in the digital domain. Thus, there is great need for a detection scheme to determine the power level Pin of the incoming RF signal Sin. Based on the determined power level Pin, the receive path's characteristics can be set to correctly adjust the power level of the signal provided to ADC 116 and 128. To this end, receiver 100 comprises automatic gain control AGC and control 130 for controlling the overall gain of system 100 based on the measured power level Pin of the incoming RF signal Sin. LNA 104, VGA 112, 114, filters 108, 120 and AC-coupling 110, 114, 122 and 126 are controllable and their respective gains and possibly other characteristics may be set to desired values as will be shown hereinafter. ACG may adjust the overall gain of receiver 100 by individually setting the respective gain of elements 104, 108-114 and 120-126 to predetermined values.

Figure 2:
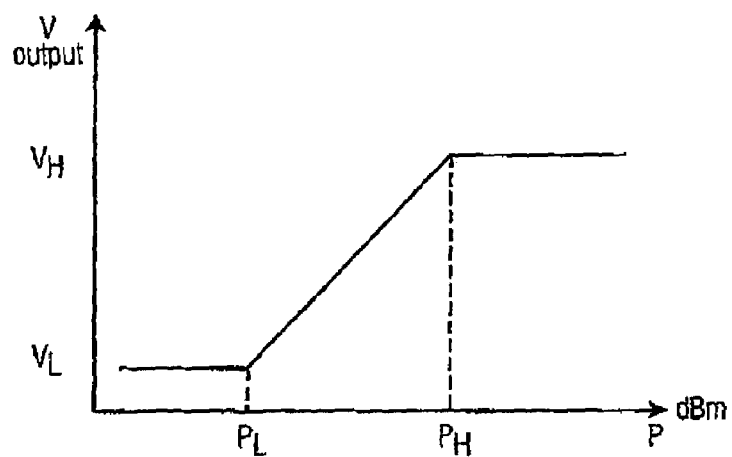
FIG. 2 illustrates an exemplary characteristic of a detector of the invention.

Receiver 100 further comprises first detector D1 coupled to AC-coupling 110 and 122, which measures the power level Pin of the incoming RF signal Sin only if power Pin is within a first resolving range of detector D1. System 100 also comprises second detector D2 coupled to AC coupling 114 and 126 and measures the power level Pin of the incoming RP signal Sin only if power Pin is within a second resolving range of detector D2. FIG. 2 shows an example of an output characteristic of a power level detector of the invention, which is for example a well-known in the art received signal strength indicator. FIG. 2 shows the output voltage V of the detector based on the power level P of the signal provided at the input of the detector. Before a lower limit $P_L$ of the resolving range, the detector does not detect the input signal and the output voltage V is a relatively low and substantially constant value $V_L$, possibly zero. The detector state does not change when a signal of power lower than $P_L$ is provided at the input, i.e. the detector does not detect the signal. When the power level P of the input signal is within the resolving range $[P_L; P_H]$, the detector produces an output voltage linearly proportional to the power level and in such case, the power level P of the input signal can be measured. Above the upper limit $P_H$ of the resolving range, the detector operates in a saturated mode and provides a relatively high and substantially constant value, $V_L$. Although the detector detects input signals of power level P greater than $P_H$, such detector cannot measure the power level of input signals having power levels P lower than $P_L$ and greater than $P_H$.

Figure 3:
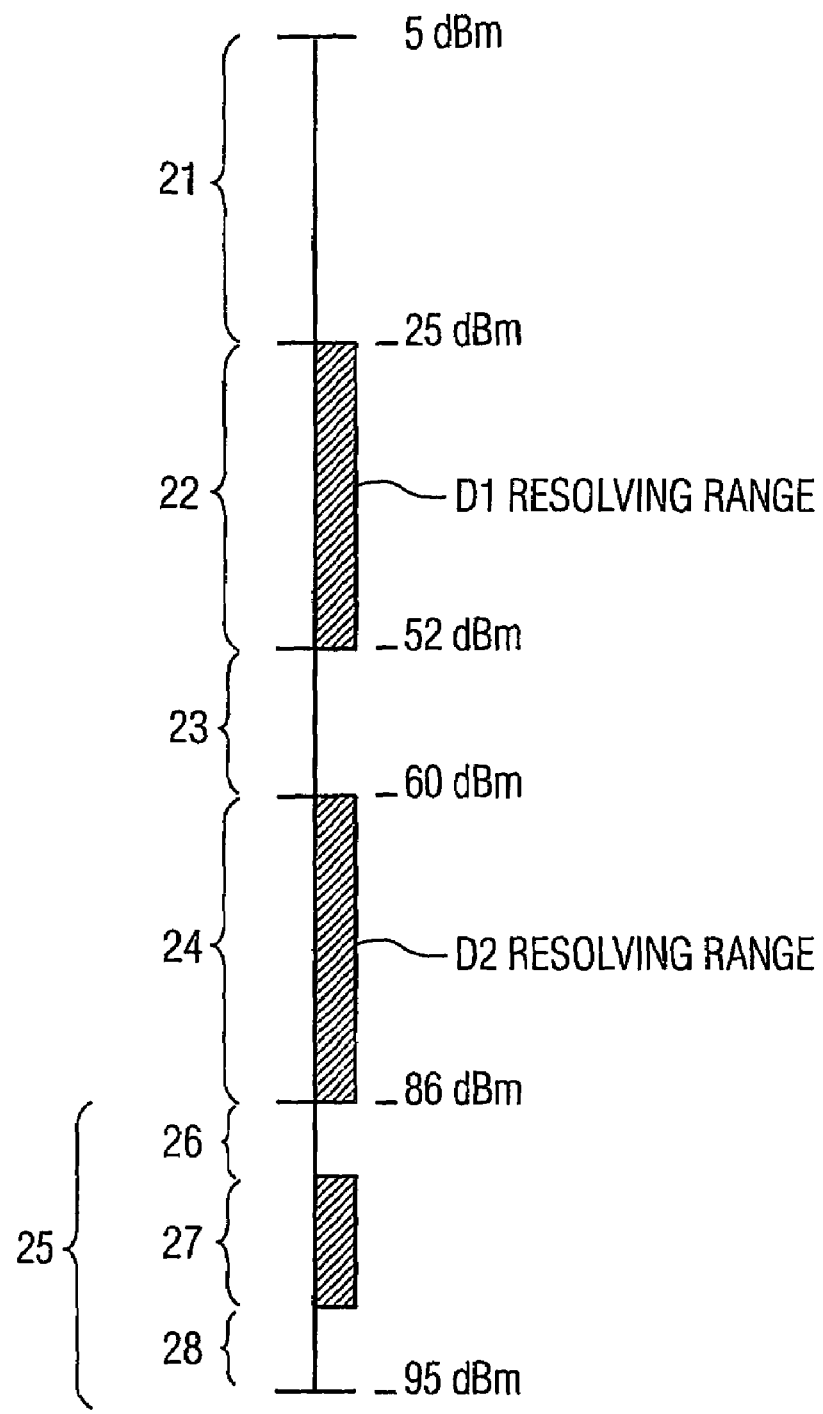
FIG. 3 shows an exemplary dynamic range of the incoming signal.

FIG. 3 shows the dynamic range of the incoming RF signal Sin and the respective resolving ranges of detectors D1 and D2. The resolving ranges of detectors D1 and D2 are given here with respect to values of the power level Pin of the incoming signal Sin and not values of the power levels of the respective input signals provided to detectors D1 and D2. In this embodiment, the resolving ranges of detectors D1 and D2 do not overlap and the resolving range of detector D2 is lower than that of detector D1. Detector D1 has a resolving range of [−52 dBm; −25 dBm], detector D2 has a resolving range of [−86 dBm; −60 dBm] and the dynamic range of RF signal Sin is [−95 dBm; 5 dBm]. The numerical values are only given here to illustrate exemplary embodiments of the invention and should not be used to limit the scope of the invention.

Both detectors D1 and D2 operate as described with reference to FIG. 2. Thus, if the power level Pin of signal Sin is greater than −25 dBm, i.e. in zone Z1, both detectors D1 and D2 will saturate. If power Pin is within [−50 dBm; −25 dBm], i.e. in zone Z2, detector D1 will provide a measurement of power Pin and detector D2 will saturate. If power Pin is within [−60 dBm, −50 dBm], i.e. in zone Z3, detector D1 will not detect signal Sin and detector D2 will saturate. If power Pin is within [−80 dBm; −60 dBm], i.e. in zone Z4, detector D1 will not detect signal Sin and detector D2 will provide a measurement of power Pin. If power Pin is within [−95 dBm; −86 dBm], i.e. in zone 5, none of detectors D1 and D2 will detect signal Sin.

Figure 4:
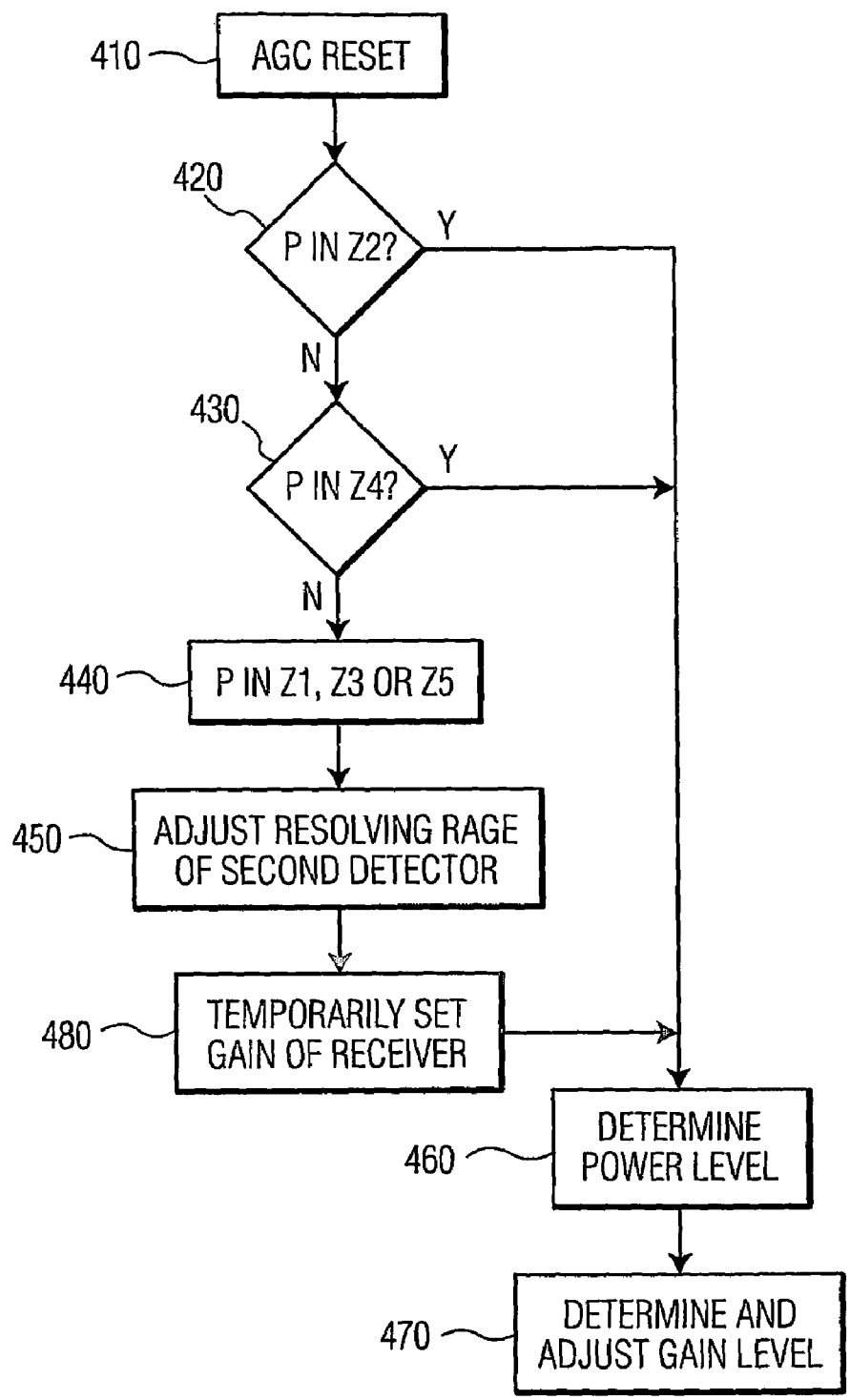
FIG. 4 shows a flow chart of a state diagram for a detection scheme according to an embodiment of the invention.

As mentioned above, AGC adjusts the gain of the individual elements of receiver 100 based on the measured power level Pin of the incoming signal Sin. Power Pin is measured following a state machine algorithm such as the exemplary one shown in FIG. 4. The state machine may be stored in AGC or in control 130 or, alternately in a digital controller of the BB portion of the communication system. In this embodiment, state machine is carried out in control 130.

The state machine permits power measurement of the incoming wireless signal Sin and adjustment of the gain of receiver 100 as follows. IEEE 802.11 specifies the transmission of communication signals using a pre-specified format comprising a preamble followed by signaling sequences and data. The gain adjustment of receiver 100 is performed during reception of the preamble so that receiver 100 is timely and correctly set-up to receive and interpret the subsequent signaling sequences and data included in signal Sin. Gain setting is therefore time critical and the invention provides a fast way of setting the gain of receiver 100 based on the power level Pin.

In a first step 410, control 130 resets AGC to a default set-up. When AGC is reset, AGC sets the overall gain of system 100 to a predetermined initial value and the individual gains of LNA 104, filters 108, 120, AC-coupling 110, 122, 114, 126 are also reset to respective predetermined initial values. Then, in a second step 420, control 130 determines whether Pin is in zone Z2. To this end, control 130 reads output of detector D1. If power Pin is in Z2, detector D1 provides a measurement of power Pin in step 460 and, in step 470, control 130 controls AGC to adjust the overall gain of system 100 accordingly. AGC may comprise a lookup table indicating individual gains of elements 108-114, 120-126 for various values of the power level Pin of the incoming signal Sin. Alternately, AGC may run pre-stored algorithms to determine respective gains of elements 108-114 and 120-126 based on the measured power level Pin.

If power Pin is not comprised in zone Z2, control determines, in step 430, if power Pin is situated in zone Z4 from reading of the output of detector D2. If detector D2 provides a measurement of power Pin in step 460, i.e. power Pin is within resolving range of detector D2, then control 130 transmit the power value Pin to AGC and in response to power Pin, AGC adjusts the overall gain by adjusting the individual gains of elements 110-114, 120-126 in step 470 as mentioned above.

If power Pin is neither in zone Z2 or Z4, control 130 determines in which zone Z1, Z3 or Z5 power Pin is located by reading the detectors' D1 and D2 respective outputs and states, i.e. saturated state or not-detecting state. Once control 130 has determined in which zone, Z1, Z3 or Z5, power Pin is located, control 130 modifies detector's D2 setting so that detector D2 can detect signal Sin. For example, control 130 shifts and reduces or extends, the resolving range of detector D2 to overlap with the zone of the dynamic range Z1, Z3 or Z5, in which the power Pin is. The new resolving range of the detector D2 may cover the entire dynamic range zone Z1, Z3 or Z5 or a portion of it.

For example, if control 130 has determined that signal Sin has a power level Pin lower than −86 dB, i.e. Pin is comprised in zone Z5, control 130 adjusts the resolving range of detector D2 to new values and the new resolving range, e.g. zone Z7 in this embodiment, now covers part of zone Z5. Control 130 may also increase the detecting resolution of detector D2 thereby increasing the accuracy of the final power measurement. For example, before adjustment detector D2 may operate at a resolution of ±2 dB and after adjustment, detector D2 may operate at a resolution of ±1 dB.

In step 480, AGC temporarily sets the overall gain of elements of receiver 100 to values associated with a power level selected by control 130 in zone 5 or situated in the new resolving range, zone 7. Control 130 may select the power level arbitrarily, e.g. in the middle of zone 5, or control 130 may compute the power level using stored computations or experimental results. A purpose of temporarily setting the gain of receiver 100 to a new value is to adjust receiver 100 to a gain that is closer to the final gain than the initial value to which receiver 100 was set in step 410.

Once AGC has adjusted the overall gain of system 100, control 130 measures power Pin. To this end, control 130 reads the output of detector D2 and, as explained with reference to FIG. 2, determines from it if power Pin is situated in zone Z6, Z8 or in zone Z7. If power Pin is determined to be in zone Z7, control 130 reads power Pin at the output of detector D2 and AGC adjusts the gain of system 100 to a known value associated with the measured power value Pin. If power Pin is either in zone Z6 or zone Z8, control 130 may reiterate step 450 and 480 and modify again the resolving range of detector D2 to cover zone Z6 or Z8. Alternately, AGC may adjust the gain of receiver 100 to an optimal gain value without further computation. For example, if control 130 has determined that power Pin lies in zone Z6, AGC may adjust the overall gain of receiver 100 to a stored or computer gain value that is deemed to be optimal for power values of zone 6.

In another embodiment of the invention, the above-described power measurement scheme is combined with antenna diversity. Receiver 100 is now equipped with at least two antennas of different characteristics. For example, the antennas' characteristics may be such that one of the antennas offers a better reception of a specific incoming signal Sin than the other antenna and, conversely, the other antenna will offer a better reception for different transmission and reception conditions. In this embodiment, control 130 carries out power measurements of the power Pin as described in step 410-440 and if control 130 determines that power Pin is lower than a predetermined threshold value, control 130 applies antenna diversity as explained hereinafter. If one of the two detectors D1 or D2 has provided a measurement of the power Pin lower than the threshold value, receiver 100 switches to the other antenna and a new power measurement is done. If the new measurement leads to a power value lower than the power value initially measured with the first antenna, receiver 100 switches back to the first antenna. AGC also adjusts gain of receiver 100 to a value associated with the initial measured power value Pin. If the new measurement with the second antenna leads to a stronger value than the power value measured with the first antenna, receiver 100 does not switch back to the first antenna and AGC adjusts the gain of receiver 100 to a value associated with the new measured value.

Alternately, if none of the detectors D1 and D2 has provided an exact measurement of power value Pin but control 130 has determined that power Pin is located in zone 5, receiver 100 may switch to the second antenna and reiterate the measurements of steps 410-440 of the state machine. If either detector D1 or D2 is then capable of providing a measurement of power Pin, receiver 100 does not switch back to the first antenna and operates with the second antenna. Alternately, before receiver 100 applies antenna diversity and switches to the second antenna, controller 130 may make a more accurate measurement of power Pin and then cause receiver 100 to switch to the second antenna. A new measurement is then performed using the second antenna and the antenna leading to the strongest measured power is used and the gain adjusted accordingly.

What is claimed is:

1. A device comprising:
an input for receiving an incoming signal with a high dynamic range; a first amplification arrangement for amplifying the incoming signal; a first detector configured to determine the power level of the incoming signal after passing through the first amplification arrangement when the power level of the incoming signal, as received at the input, is within a first resolving power-indicated range in which the detector provides an approximately linearly proportional output with respect to the incoming signal;
a second amplification arrangement connected to the first amplification arrangement;
an analog-to-digital converter for performing analog-to-digital conversion of a signal derived from an output signal of the second amplification arrangement;
a second detector coupled between the second amplification arrangement and the analog-to-digital converter, configured to determine the power level of the incoming signal after further passing the incoming signal through the second amplification arrangement, when the power level of the incoming signal, as received at the input, is within a second resolving power-indicated range in which the detector provides an approximately linearly proportional output with respect to the incoming signal, the second resolving power-indicated range being lower than the first resolving power-indicated range; and, a gain control unit for, in response to the power level of the incoming signal being within one of the first resolving power-indicated range and the second resolving power-indicated range, controlling respective gains of the first and second amplification arrangements based on a determination of the power level by the first or the second detector and in response to the power level of the incoming signal, as received at the input, not being within either of the first resolving power-indicated range and the second resolving power-indicated range, modifying the respective resolving power-indicated range for one of the first detector and the second detector based on respective output states of the first and second detectors.

2. The device of claim 1, wherein the first and second resolving power-indicated ranges do not overlap.

3. The device of claim 1, further comprising: a controller for determining a portion of the dynamic range from respective output states of the first and second detector, and modifying a setting of one of the two detectors to operate with a new resolving power-indicated range overlapping the portion; and wherein, when the portion is not in the first and second resolving power-indicated ranges, the gain control unit further adjusts the respective gains of the first and second amplification arrangements before the controller determines the power level of the incoming signal from the detector operating with the new resolving power-indicated range.

4. The device of claim 3, wherein in response to the power level being between a lower limit value of the first resolving power-indicated range and an upper limit value of the second resolving power-indicated range, the gain control unit adjusts the gains of the first and second amplification arrangements to respective known gain values associated with a selected power value located between the upper limit value and the lower limit value.

5. The device of claim 3, wherein in response to the power level of the incoming signal being below a lower limit value of the second resolving power-indicated range, the gain control unit adjusts the gains of the first and second amplification arrangements to respective known gain values associated with a power value lower than the lower limit value of the second resolving power-indicated range.

6. The device of claim 3, wherein in response to the power level of the incoming signal being above an upper limit value of the first resolving power-indicated range, the control unit adjusts the gains of the first and second amplification arrangements to respective known gain values associated with a power value above the upper limit of the first resolving power-indicated range.

7. The device of claim 1, wherein the power level determined by the first detector or the second detector depends upon a respective operating resolution of the first detector or the second detector.

8. The device of claim 1, further comprising: an antenna diversity controller for applying antenna diversity using a first and a second antennae.

9. A method for adjusting a gain of a receiver comprising an input receiving an incoming signal with a high dynamic range connected to a first amplification stage followed a second amplification stage followed by an analog-to-digital converter, the method comprises:

determining by a first detector the power level of the input signal after amplification by the first amplification stage in response to the power level of the incoming signal as received at the input is in a first resolving power-indicated range associated with the first detector in which the detector provides an approximately linearly proportional output with respect to the incoming signal;

at a point intermediate the second amplification stage and the analog-to-digital converter, determining by a second detector the power level of the input signal after further amplification by the second amplification stage, in response to power levels of the incoming signal, as received at the input, being in a second resolving power-indicated range associated with the second detector in which the detector provides an approximately linearly proportional output with respect to the incoming signal;

adjusting respective gains of the first amplification stage and second amplification stage based on the power level determined by the first or the second detector and further, in response to the power level of the incoming signal, as received at the input, being outside of the first resolving power-indicated range and outside of the second resolving power-indicated range, modifying the settings of one of the first detector and the second detector to change the respective resolving power-indicated range based on respective outputs of the first and second detectors.

10. A receiver circuit comprising:

a first gain stage for amplifying a received signal to produce a first amplified signal;

a first detector that within a first resolving power-indicated range produces an output voltage that is approximately linearly proportional to the power level of the first amplified signal and that has a saturation state and a non-detection state for which the detector provides respective outputs;

a second gain stage for amplifying the first amplified signal to produce a second amplified signal;

a second detector that within a second resolving power-indicated range produces an output voltage that is approximately linearly proportional to the power level of the second amplified signal and that has a saturation state and a non-detection state for which the detector provides respective outputs; and a controller for, in response to determined power levels, adjusting gain of one of the first and second gain stages and for, in response to the saturation and non-detection states of first and second detector states, modifying one of the first resolving power-indicated range and the second resolving power-indicated range for the respective detector, wherein, with respect to a power level of the received signal the second resolving power-indicated range is lower than the first resolving power-indicated range.

11. The circuit of claim 10, wherein modifying the resolving power-indicated range includes adjusting the resolution of the one of the first and second detectors.

12. The circuit of claim 10, wherein modifying the resolving power-indicated range is accomplished without changing a gain of the first and second gain stages.

13. The circuit of claim 10, wherein with respect to a power level of the received signal the first resolving power-indicated range does not overlap the second resolving power-indicated range.

* * * * *